(12) United States Patent
Iehisa

(10) Patent No.: US 7,088,761 B2
(45) Date of Patent: Aug. 8, 2006

(54) LASER APPARATUS

(75) Inventor: Nobuaki Iehisa, Shizuoka (JP)

(73) Assignee: Kataoka Corporation, Kyoto (JP)

( * ) Notice: Subject to any disclaimer, the term of this patent is extended or adjusted under 35 U.S.C. 154(b) by 187 days.

(21) Appl. No.: 10/492,049

(22) PCT Filed: Feb. 18, 2002

(86) PCT No.: PCT/JP02/01389

§ 371 (c)(1), (2), (4) Date: Apr. 7, 2004

(87) PCT Pub. No.: WO03/034554

PCT Pub. Date: Apr. 24, 2003

(65) Prior Publication Data

US 2004/0264540 A1    Dec. 30, 2004

(30) Foreign Application Priority Data

Oct. 16, 2001 (JP) ............................. 2001-318643

(51) Int. Cl.
*H01S 3/091* (2006.01)
*H01S 3/08* (2006.01)
*B01K 26/00* (2006.01)

(52) U.S. Cl. ....................... 372/101; 372/75; 219/121.7

(58) Field of Classification Search ................. 372/101
See application file for complete search history.

(56) References Cited

U.S. PATENT DOCUMENTS 5,325,393 A    6/1994  Nighan, Jr. et al.
2002/0000426 A1*  1/2002  Mead et al. .............. 219/121.7

FOREIGN PATENT DOCUMENTS

| JP | 5-92284    | 4/1993   |
| JP | 6-314832   | 11/1994  |
| JP | 6-326389   | 11/1994  |
| JP | 6326389    | * 11/1994 |
| JP | 2001-119101| 4/2001   |
| JP | 2001-196665| 7/2001   |

* cited by examiner

*Primary Examiner*—Armando Rodriguez
(74) *Attorney, Agent, or Firm*—Westerman, Hattori, Daniels & Adrian, LLP.

(57) ABSTRACT

A laser system is constructed so that a solid-state laser beam emitted from an Nd:YAG laser unit and a laser diode beam emitted from a combining LD which oscillates in a wavelength range shorter than that of the solid-state laser beam are combined by a dichroic beam splitter, the resultant beam is guided to an optical fiber, and a workpiece is irradiated with the combining LD beam and the solid-state laser beam with absolute irradiation positions and irradiation shapes of the beams almost matched each other. Thus, problems of high cost and high power consumption of the laser system due to low energy conversion efficiency, which become problems in a high-output high-luminance solid-state laser unit can be solved.

7 Claims, 3 Drawing Sheets

LASER APPARATUS

TECHNICAL FIELD

The present invention relates to a laser system constructed mainly by a high-output high-intensity solid-state laser unit and having largely improved power efficiency.

BACKGROUND ART

In recent years, the technique for increasing output and intensity of a solid-state laser unit has been developed and a solid-state laser unit satisfying both of the performances has been realized. Consequently, precise welding and micro removing process which could not be realized by conventional processors can be performed very precisely at high speed. A high-output high-intensity solid-state laser unit has come to be actively used for spot welding and seam welding process for electric and electronic parts and for scribing and cutting process for metals, semiconductors, ceramics, and the like.

As a representative example of a conventional solid-state laser unit, FIG. 3 shows the configuration of an LD (Laser Diode)-pumped pulse type Nd:YAG laser system whose laser active medium is a rod type Nd:YAG crystal and whose average output is 300 W class which is most spread in the markets.

An Nd:YAG crystal 1 is pumped by LD beams 3 emitted from LDs 2 as a pumping source. Light of 1.06 µm emitted from the Nd:YAG crystal 1 is selectively amplified between a total reflection mirror 5 and an output coupling mirror 6 constructing a laser resonator 4. The amplified light goes out as an Nd:YAG laser beam 7 from the output coupling mirror 6. A control on the Nd:YAG laser output according to use is performed by a DC stabilizing power source 8 which is electrically coupled to the LDs 2. To maintain a stable Nd:YAG laser output, the temperatures of the Nd:YAG crystal 1 and the LDs 2 are controlled directly or via a cooling medium supplied from a cooling medium supplying apparatus 9 so that the temperatures of the peripheral parts become constant.

The Nd:YAG laser beam 7 is condensed by an incident light condensing optical system 10 so as to satisfy transfer conditions of an optical fiber 11 for transmission having a core diameter of 0.3 mm. The laser beam emitted from the optical fiber 11 is shaped or condensed by an outgoing light condensing optical system 14 so as to have a beam shape adapted to processing on a workpiece 13 placed on a CNC table 12, and desired laser processing is performed.

In the conventional configuration, however, energy conversion efficiency (hereinbelow, called "electricity-light conversion efficiency") of a laser beam emitted from the laser system from the electric energy input to the LD for pumping in the case of performing laser processing is a very low value which is about 10 to 20%. A breakdown of the value is that electricity-light conversion efficiency of the LD for pumping is 30 to 50%, and energy conversion efficiency from the energy of LD-pumped light to an Nd/YAG laser beam (hereinbelow, called "light-light conversion efficiency") is 35 to 50%. The "electricity-light conversion efficiency" is the product of the "electricity-light conversion efficiency of LD" and "light-light conversion efficiency".

Further, as shown in FIG. 4, the energy absorptance with respect to laser beams of general industrial materials of aluminum (hereinbelow, expressed as "Al"), copper (hereinbelow, expressed as "Cu"), and iron (hereinbelow, expressed as "Fe") is about 5%, 2%, and 36%, respectively, at an oscillation wavelength of 1.06 µm of an Nd:YAG laser beam (the source: J. H. Weaver, "Physics Data—Optical Properties of Metal").

Accordingly, the ratio of energy absorbed by a workpiece in the electric energy which is actually input to an LD is lower. The energy ratio is very low and is 0.5 to 1% in the case of Al, and 3.5 to 7% even in the case of Fe having high absorptance.

Although a laser processor on which a conventional solid-state laser unit is mounted can obtain high-speed high-precision processing performance, it has a problem such that, due to the very low ratio of energy utilization, the introduction and operation costs of a laser system are high. All of the remaining energy which is not shifted or converted to the final Nd:YAG laser beam becomes heat by which a cooling medium for cooling the LDs and the Nd:YAG crystal is heated. As a result, the heat is exhausted from the cooling apparatus to the periphery. Although the laser is clean, a secondary problem such that the laser emits heat to the peripheral environment occurs.

In consideration of such a problem, an attempt to use an LD beam having electricity-light conversion efficiency of 40% or higher directly for processing has been made. However, the condensability of the LD light is low and it is difficult to transmit an output of a 300 W class necessary for use in general processing via an optical fiber having a small diameter of 0.3 mm or less.

The present invention provides a laser system which solves problems of high cost and high power consumption of the laser system due to low energy conversion efficiency, which are problems in a high-output high-intensity solid-state laser unit.

DISCLOSURE OF THE INVENTION

The present invention provides, to solve the problems, a technique for increasing absorptance of a solid-state laser beam and achieving higher general efficiency of a laser system by heating a process point of a solid-state laser beam by another means simultaneously or in advance by using a physical phenomenon that light absorptance increases with rise in the temperature of a base material of a metal material.

If a portion which is unnecessary to be processed is also heated, desired processing precision cannot be obtained and, moreover, an energy loss occurs. Consequently, it is necessary to heat a process point concentratedly. For this purpose, by combining light for heating to an optical fiber for transmitting the solid-state laser beam, the same process point is irradiated with the solid-state laser beam and the combined light.

The core diameter of the optical fiber for transmitting the solid-state laser beam is generally 0.3 mm or less in order to execute microprocessing at high precision. The light to be combined has to be transmitted via the narrow-diameter fiber at high efficiency. Therefore, if a laser beam is not used as the light to be combined, it is impossible to realize the object.

As a laser beam to be combined, on the basis of estimation from the absorption characteristics of general metal materials shown in FIG. 4, if a laser beam having a wavelength shorter than the oscillation wavelength of 1.06 μm of an Nd:YAG laser beam is used as a laser system to be combined, the absorptance of a metal increases. Consequently, a heating effect of a workpiece which is preliminarily performed also increases.

Therefore, as a laser system for combining, a laser diode as a laser system for emitting light having a wavelength shorter than that of an Nd:YAG laser beam and having beam condensability which is almost the same as that of an Nd:YAG laser beam and having, moreover, the highest oscillation efficiency of a laser system is selected.

As an LD is generally used as a pumping source of a solid-state laser unit having the conventional configuration, it is difficult for an LD to condense light into a small shape. However, when an output level is 50 W or less, by performing optical rearrangement of light emission points and correction of a laser beam spread angle, the LD can condense light to a diameter of less than 0.3 mm.

By applying the laser beam combining and synthesizing technique according to the present invention, without deteriorating precision and high speed of processing, the laser processing efficiency can be largely improved, so that an output of a solid-state laser can be reduced. As a result, reduction in the size of the solid-state laser unit, that is, reduction in the size of a solid-state crystal, and reduction of the number of high-cost parts such as reduction in the number of LDs for pumping can be realized. Moreover, the operating costs of the laser system can be reduced and an influence on the peripheral environment can be largely improved.

BEST MODE FOR CARRYING OUT THE INVENTION

An embodiment of the present invention will be described hereinbelow with reference to the drawings.

Figure 1:
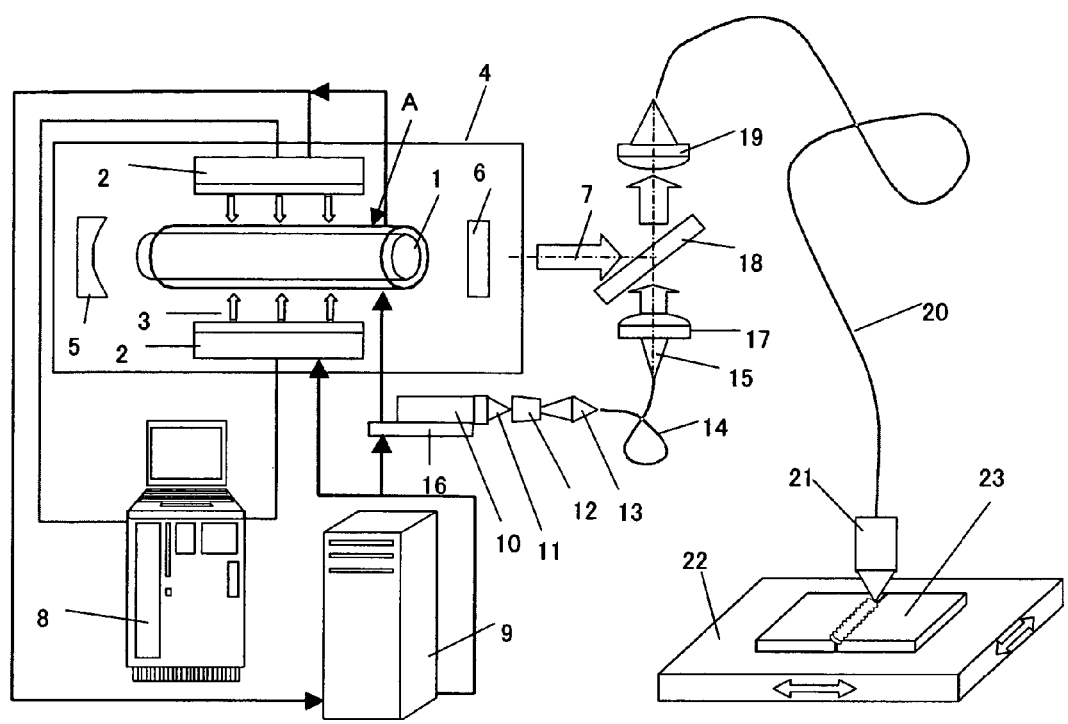
FIG. 1 is a schematic configuration diagram showing an embodiment of the present invention.

With respect to an embodiment of the present invention, FIG. 1 shows a configuration of a laser system of which laser active medium for the main purpose of laser-welding of Al is a rod-shaped Yd:YAG crystal and which is constructed mainly by an LD-pumped pulse type Nd:YAG laser unit A (corresponding to a solid-state laser unit of the present invention) whose average output is a 300 W class.

An Nd:YAG crystal 1 having a rod diameter of φ5 mm and a length of 116 mm is pumped by an LD beam 3 emitted from an LD pumping unit 2 on which 60 bars of LDs of 20 W/bar oscillating at a center wavelength of 808 nm are mounted. A beam of 1.06 μm emitted from the Nd:YAG crystal 1 is selectively amplified between a total reflection mirror 5 and an output coupling mirror 6 having reflectivity of 70% which construct a laser resonator 4 having a resonator length of 400 mm. The amplified light emits as an Nd:YAG laser beam 7 (corresponding to a solid-state laser beam of the present invention) from the output coupling mirror 6. A control on the Nd:YAG laser output according to use is performed by a DC stabilizing power source 8 which is electrically coupled to the LDs 2. To maintain a stable Nd:YAG laser output, the temperatures of the Nd:YAG crystal 1 and the LDs 2 are controlled directly or via pure water supplied from a pure water cooling apparatus 9 so that the temperatures of the peripheral parts become constant temperature. In the configuration, the maximum average laser output of 290 W of the Nd:YAG laser beam 7 was obtained when LD peak current was 110 A, pulse width was 0.5 msec, pulse rate was 200 Hz, and pure water temperature was 11° C.

On the other hand, a combining LD 10 for emitting a combining LD (Laser Diode) beam 11 to be combined with the Nd:YAG laser beam 7 from the Nd:YAG laser unit A is of a continuous output type and oscillates at a center wavelength of 808 nm. The combining LD beam 11 having an oval shape passes through a cylindrical collimation lens 12 for fast axis and slow axis to reduce the spread angel and is led via a combining LD beam incident optical system 13 to a step index type (hereinbelow, referred to as SI type) optical fiber 14 for beam shaping having core diameter of 0.2 mm. The light is shaped and emitted as a combining LD beam 15 having an almost uniform circular shape in all of directions at a fiber emission end. The combining LD 10 is fixed on a cooling plate 16 in which cooling water passes. The LD itself is indirectly cooled.

The combining LD beam 15 having a circular shape is collimated by a plano-convex collimation lens 17 so as to have the same shape as the Nd:YAG laser beam 7. After that, by the Nd:YAG laser beam 7 and a dichroic beam splitter 18, laser outputs are combined. The Nd:YAG laser beam 7 is arranged on the side opposite of the dichroic beam splitter 18, the combining LD beam 15 having the circular shape is arranged on the transmission side, and an optical axis adjustment is made so that the laser beams 7 and 15 overlap coaxially. After that, a composite laser beam is condensed by an incident light condensing optical system 19 so as to satisfy the transmission conditions of an SI type optical fiber 20 for transmission having a core diameter of 0.3 mm and a transmission distance of 20 m, and is led to the optical fiber 20 for transmission. The laser beam emitted from the optical fiber 20 for transmission is condensed by an outgoing light condensing optical system 21 having a processing focal length of 100 mm so that a beam shape adapted to processing is obtained. A workpiece 23 placed on a CNC table 22 is irradiated with the condensed laser beam and desired laser processing is performed. On the outgoing light condensing optical system 21, an optical part having transmittance of 98% or higher in both of a wavelength region of the Nd:YAG laser beam having a wavelength of 1.06 μm and a wavelength region of the combining LD beam having a wavelength of 808 nm is mounted.

The workpiece 23 is irradiated with the combining LD beam 15 before or simultaneously with irradiation of the Nd:YAG laser beam 7. An outgoing laser output value of the combining LD 10, an Nd:YAG laser output value, and ON/OFF of irradiation can be variably independently controlled.

Figure 2:
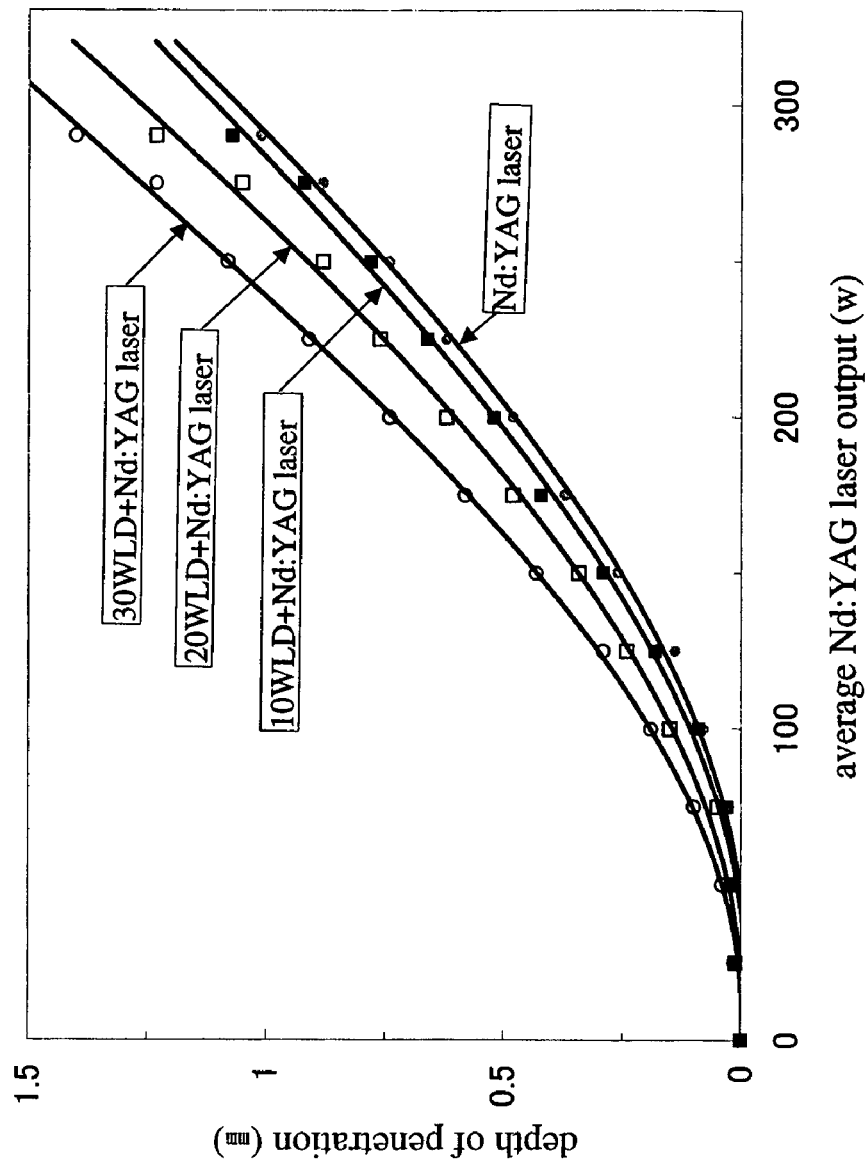
FIG. 2 is a graph showing welding processing characteristics in the embodiment.
Figure 3:
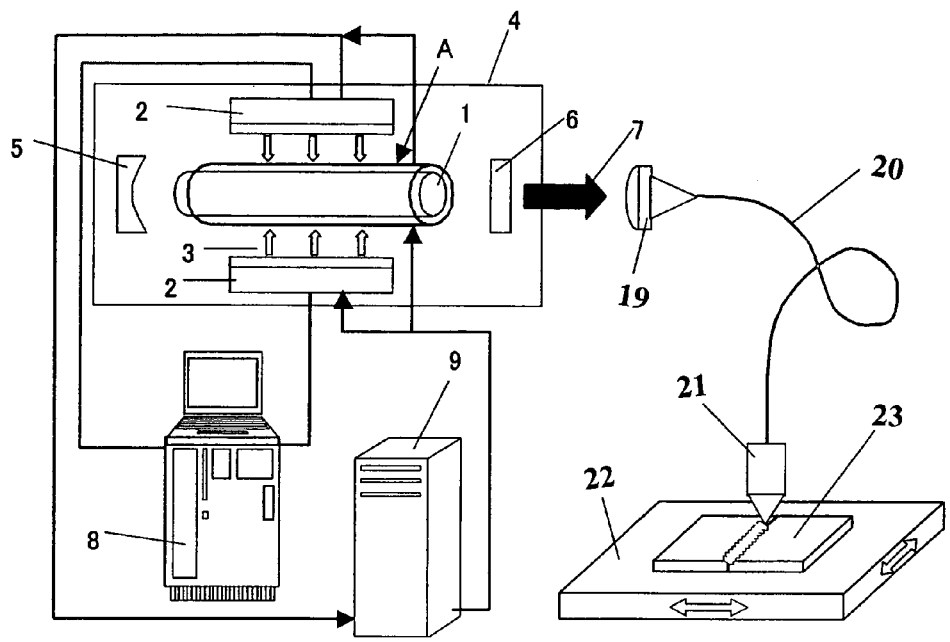
FIG. 3 is a diagram showing a schematic configuration of a conventional technique.
Figure 4:
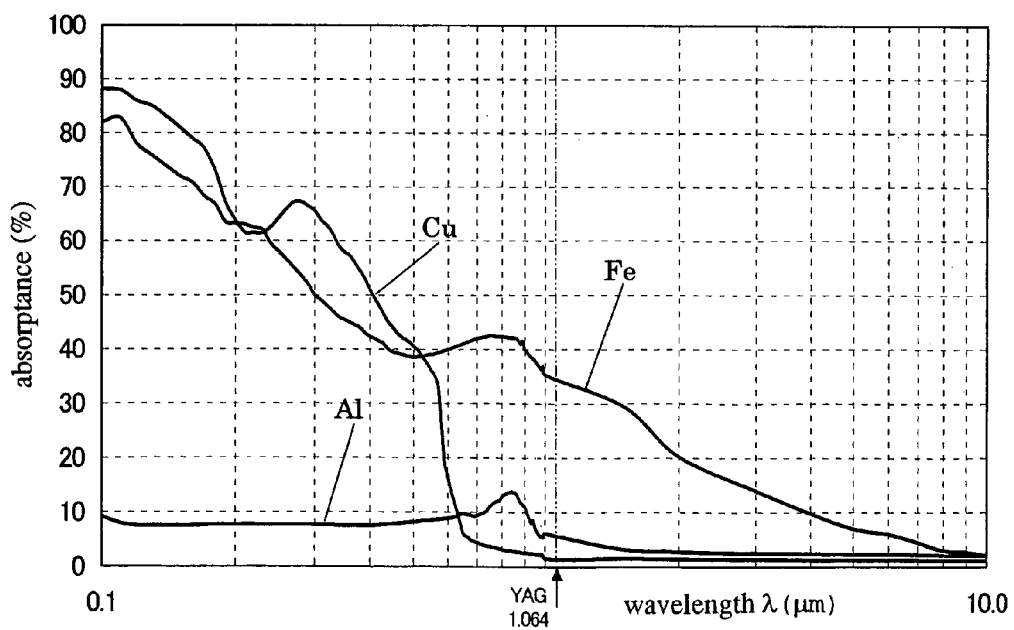
FIG. 4 is a graph showing energy absorptance with respect to the wavelengths of materials.

FIG. 2 shows results of experiments for comparison between welding performances in the case of using only the Nd:YAG laser beam 7 and welding performances in the case where the combining LD beam 15 is combined with the laser beam 7. In the experiment, as a test piece, a JIS standard #3003 aluminum member was used, processing speed was fixed at 20 mm/sec, and a nitrogen ($N_2$) gas was supplied as a shield gas around a process point at a flow of 10 liters/minute.

As understood from the diagram, in the case of using only the Nd:YAG laser beam 7, when an average laser output is 250 W, the maximum depth of penetration of 0.74 mm was obtained with nugget diameter of 0.4 mm. When a laser output of the combining LD beam 15 of 10 W was combined, the penetration became deeper by about 5% as compared with the case of using only the Nd:YAG laser beam 7. In the case where the laser outputs of the LD beam 15 are 20 W and 30 W, the penetration amount increase by about 19% and 46%, respectively. By the single Nd:YAG laser unit A, when the maximum average laser output was 290 W, the maximum depth of penetration of 1.0 mm was obtained. In the case of combining the LD beam 15 of 30 W, with laser outputs of 240 W as an average of the single Nd:YAG laser unit A, the same depth of penetration was obtained. Thus, an average laser output of about 50 W in the single Nd:YAG laser unit A could be reduced.

The power consumption when the depth of penetration of 1.0 mm was obtained was measured. As a result, in the case where 290 W is output as an average by the single Nd:YAG laser unit A, the power consumption was 2,015 W. In the case where 30 W of the LD beam 15 was combined and an output of the single Nd:YAG laser unit A was 240 W, the power consumption was 1750 W. That is, the same processing could be performed with an energy amount which is smaller by 13%.

At that time, the workpiece is irradiated with the combining LD beam 15 before or simultaneously with irradiation of the Nd:YAG laser beam 7, and an outgoing laser output value of the combining LD 10, an output value of the Nd:YAG laser unit A, and ON/OFF of irradiation can be variably controlled independently. Consequently, by properly adjusting the timing and the degree of heating of a process point, higher efficiency can be effectively pursued.

In particular, before combining with the Nd:YAG laser beam 15 in the dichroic beam splitter 18, the spread angle of the combining LD beam 11 emitted from the combining LD 10 is corrected by using the collimation lens 12 so as to be almost uniform in all of directions. After that, the laser beam is led to the optical fiber 14 for beam shaping where the LD emission mode pattern is formed circular and the beam qualities in the radial direction are made uniform, and the resultant beam is combined with the Nd:YAG laser beam 7 in the dichroic beam splitter 18. Consequently, the LD beam 11 for heating can be condensed to a diameter smaller than 0.3 mm, and high-efficiency heating on a processing point can be made effective.

Further, the Nd:YAG laser unit in the embodiment is a solid-state laser unit using the LD pumping unit 2 as a pumping source. The LD 10 for emitting a beam having the same wavelength as that of light emitted from the solid-state laser pumping LD is also used as a combining laser diode. Therefore, reliability of the combining LD is high, and the LD can be obtained cheaply.

Since only a necessary process point is heated and an unnecessary part is not heated, when an emission mode of the combining LD beam 11 from the combining LD 10 is replaced with a continuous mode of continuously emitting laser outputs which are constant with respect to time, there is no problem. Thus, the laser beam absorptance at a process point can be effectively increased.

The present invention is not limited to the concrete configuration of each of the parts in the foregoing embodiment.

For example, in the embodiment, the laser diode for emitting a laser beam having the same wavelength as that of the laser diode for pumping the Nd:YAG laser in a wavelength band of ±3 nm or less is used as the laser diode for combining. If the wavelength band of the laser diode for combining is ±50 nm or less of that of the laser diode for pumping, from the viewpoint of absorption characteristics of metals and ceramics to be processed, generally, effects similar to those of the embodiment can be expected.

Although the laser diode of the continuous output type is used as the laser diode for combining in the embodiment, effects similar to those of the embodiment can be expected for a laser diode of pulse output type.

Further, in the foregoing embodiment, the case of the Nd:YAG laser whose laser active medium is the Nd:YAG crystal has been described. Also in the case where the laser active medium is a single solid-state crystal such as Yb:YAG or Nd:YVO$_4$, a combination of the solid-state crystals, or a ceramic crystal, effects similar to those of the embodiment can be expected.

The other configurations can be also variously modified without departing from the gist of the present invention.

INDUSTRIAL APPLICABILITY

The present invention can provide a laser system having the configuration as described above, which can realize large reduction in power and is more environmentally friendly without deteriorating precision and high speed of laser processing. In addition, the smaller size of the laser system can be realized, so that the laser system which can contribute to smaller resources can be provided.

The invention claimed is:

1. A laser system characterized in that a solid state laser beam emitted from a solid state laser unit, and a laser diode beam emitted from a laser diode which oscillates in a wavelength range shorter than that of the solid state laser beam, are combined by a dichroic beam splitter; wherein,
   a diameter of the laser diode beam is condensed to less than a core diameter of an optical fiber capable of transmitting the solid state laser beam, the laser diode beam then being combined with the solid state laser beam, whereby the resultant combined beam is incident to the optical fiber capable of transmitting the solid state laser beam; and said resultant combined beam is guided in space by the optical fiber to a workpiece, which is irradiated with the laser diode beam and the solid state laser beam with absolute irradiation positions and irradiation shapes of the laser diode and solid state beams almost matching each other.

2. The laser system according to claim 1, wherein before the laser diode beam is combined with the solid state laser, the laser diode beam is transmitted through an optical fiber for shaping said beam in order to condense the diameter of the laser diode beam to less than the core diameter of the optical fiber capable of transmitting the solid state laser beam.

3. The laser system according to claim 1, characterized in that the workpiece is irradiated with said combining laser diode beam before or simultaneously with irradiation of the solid state laser beam, and an outgoing laser output value of the laser diode, a solid state laser output value, and ON/OFF of irradiation can be variably controlled independently.

4. A laser system characterized in that a solid state laser beam emitted from a solid state laser unit and a laser diode beam emitted from a laser diode which oscillates in a wavelength range shorter than that of the solid state laser beam are combined by a dichroic beam splitter, the resultant beam being guided in space to the same transmission medium, and a workpiece is irradiated with the laser diode beam and the solid state laser beam with absolute irradiation positions and irradiation shapes of the beams almost matching each other; wherein before combining the solid state laser beam with the laser diode in the dichroic beam splitter, the spread angle of the combining laser diode beam which is emitted from said laser diode is corrected so as to be almost uniform in all of directions by using a single cylindrical lens or a plurality of cylindrical lenses, after that, the resultant laser beam is led to an optical fiber by which a laser diode emission mode pattern is formed circular and beam qualities in the radial direction are made uniform, and the resultant beam is combined with the solid state laser beam in the dichroic beam splitter.

5. The laser system according to claim 1, characterized in that said solid state laser unit is a solid state laser unit using a laser diode as a pumping source and using, as the combining laser diode, a laser diode for emitting a laser beam having the same wavelength as that of the laser diode for pumping the solid state laser in a wavelength range of ±50 nm or less.

6. The laser system according to claim 1, characterized in that a laser beam emission mode from the combining laser diode is a continuous mode of continuously emitting laser outputs which are constant with respect to time or a pulse output mode in which laser outputs change with time.

7. The laser system according to claim 1, characterized in that a laser active medium of the solid state laser unit is a single solid state crystal such as Nd:YAG, Yb:YAG, or Nd:YVO$_4$, a combination of the single solid state crystals, or a ceramic crystal.

* * * * *